(12) United States Patent
Luan

(10) Patent No.: US 9,385,153 B2
(45) Date of Patent: Jul. 5, 2016

(54) IMAGE SENSOR DEVICE WITH FLEXIBLE INTERCONNECT LAYER AND RELATED METHODS

(71) Applicant: STMICROELECTRONICS PTE LTD, Singapore (SG)

(72) Inventor: Jing-En Luan, Shenzhen (CN)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 14/740,468

(22) Filed: Jun. 16, 2015

(65) Prior Publication Data

US 2016/0104737 A1 Apr. 14, 2016

(30) Foreign Application Priority Data

Oct. 11, 2014 (CN) .......................... 2014 1 0537531

(51) Int. Cl.
*H01L 27/00* (2006.01)
*H01L 27/146* (2006.01)

(52) U.S. Cl.
CPC ...... *H01L 27/14636* (2013.01); *H01L 27/1462* (2013.01); *H01L 27/14625* (2013.01); *H01L 27/14685* (2013.01)

(58) Field of Classification Search
CPC .................... H01L 27/14636; H01L 27/1462; H01L 27/14625; H01L 27/14685; H01L 27/14601
See application file for complete search history.

(56) References Cited

U.S. PATENT DOCUMENTS

| | | | |
|---|---|---|---|
| 7,911,017 B1* | 3/2011 | de Guzman | G02B 7/021 257/234 |
| 8,305,698 B2 | 11/2012 | Ozaki | |
| 8,780,458 B2* | 7/2014 | Sano | G02B 13/18 359/714 |
| 2009/0014822 A1 | 1/2009 | Poo et al. | |
| 2009/0057544 A1 | 3/2009 | Brodie et al. | |
| 2012/0293704 A1* | 11/2012 | Sano | G02B 13/18 348/340 |
| 2014/0184809 A1 | 7/2014 | Luan | |
| 2015/0028187 A1 | 1/2015 | Jin et al. | |

* cited by examiner

*Primary Examiner* — Nikolay Yushin
(74) *Attorney, Agent, or Firm* — Allen, Dyer, Doppelt, Milbrath & Gilchrist, P.A.

(57) ABSTRACT

An image sensor device may include an interconnect layer having an opening extending therethrough, an image sensor IC within the opening and having an image sensing surface, and an IR filter aligned with the image sensing surface. The image sensor device may include an encapsulation material laterally surrounding the image sensor IC and filling the opening, and a flexible interconnect layer coupled to the interconnect layer opposite the image sensing surface.

24 Claims, 5 Drawing Sheets

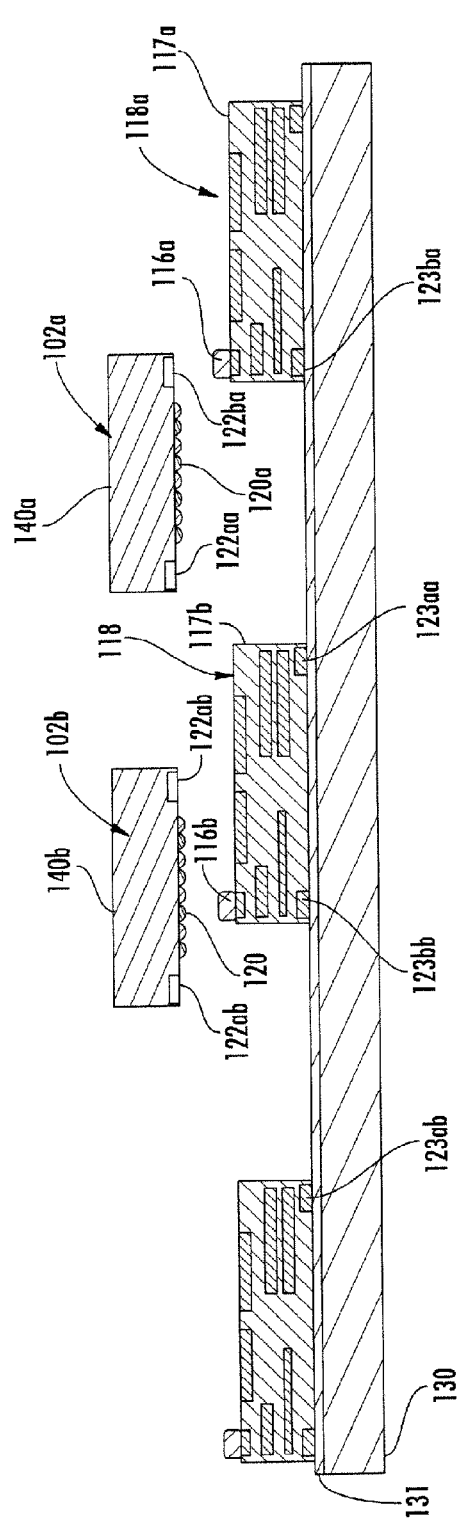
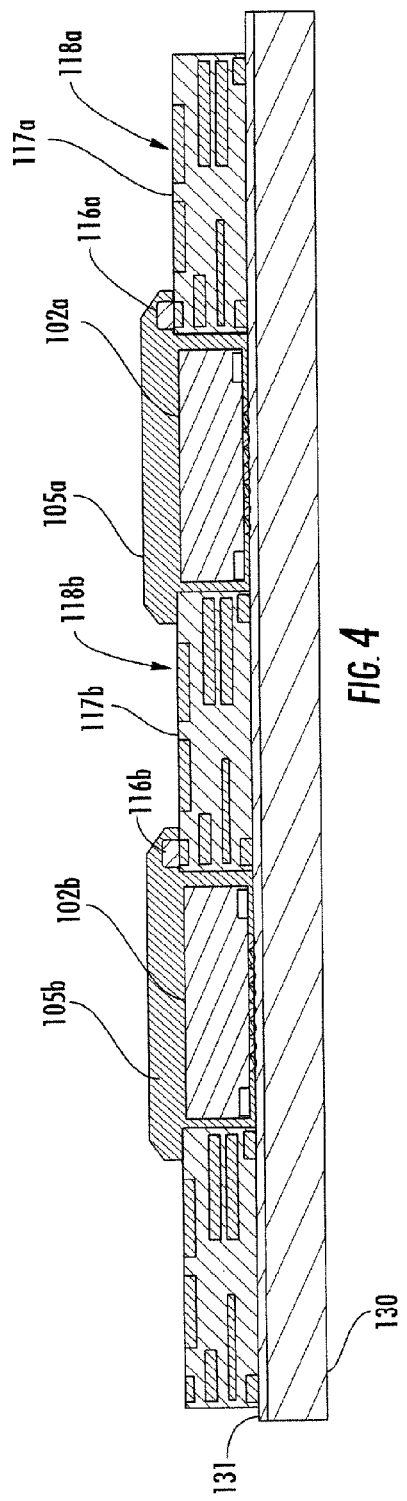

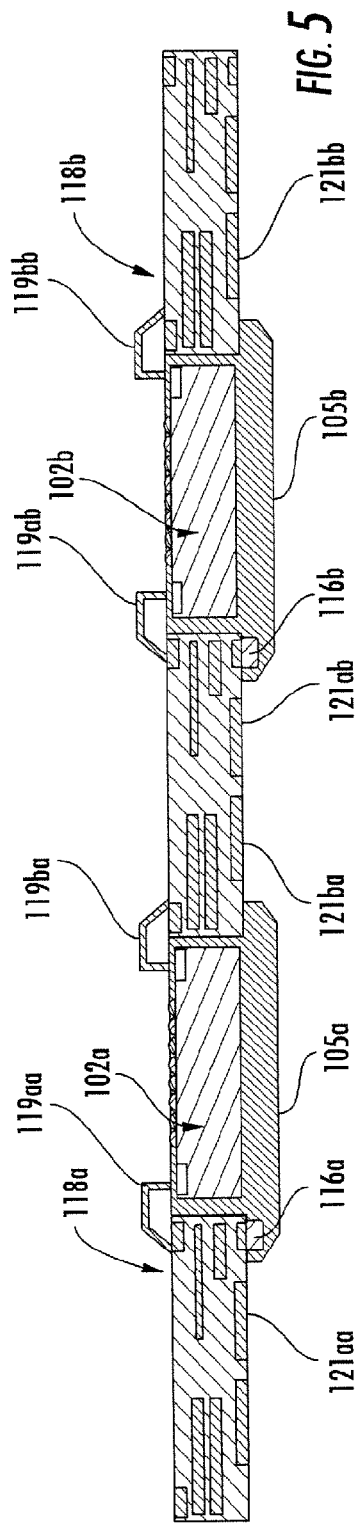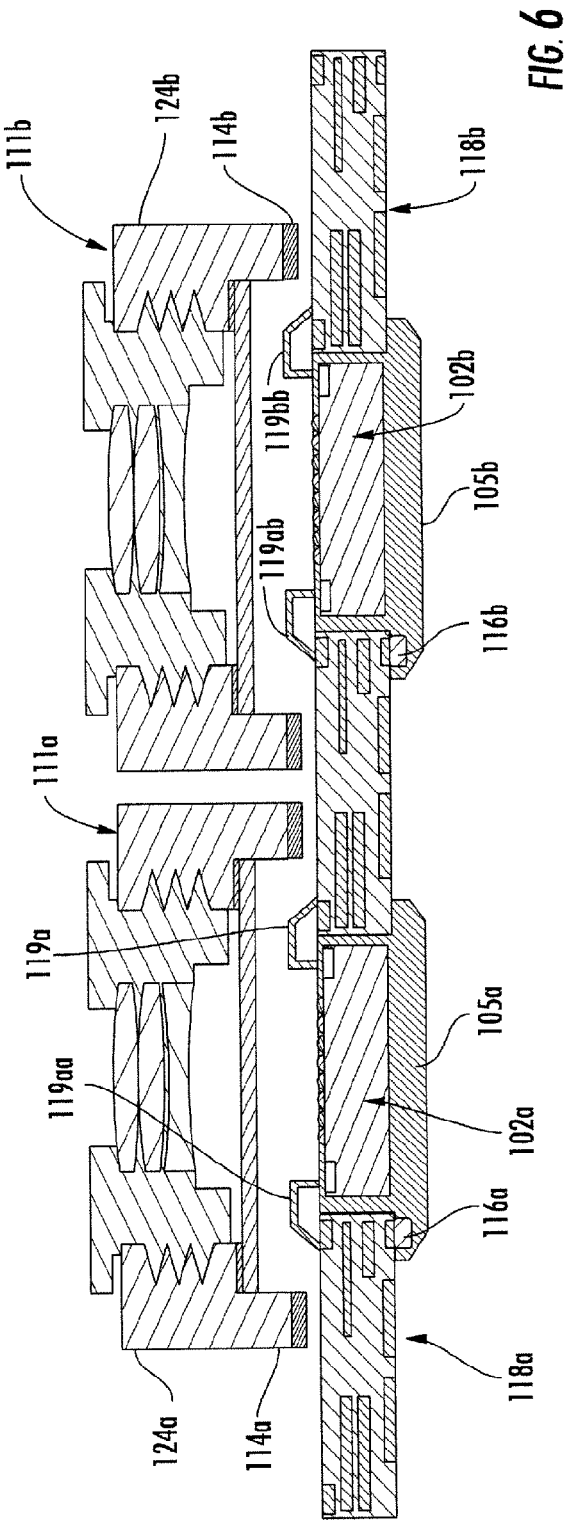

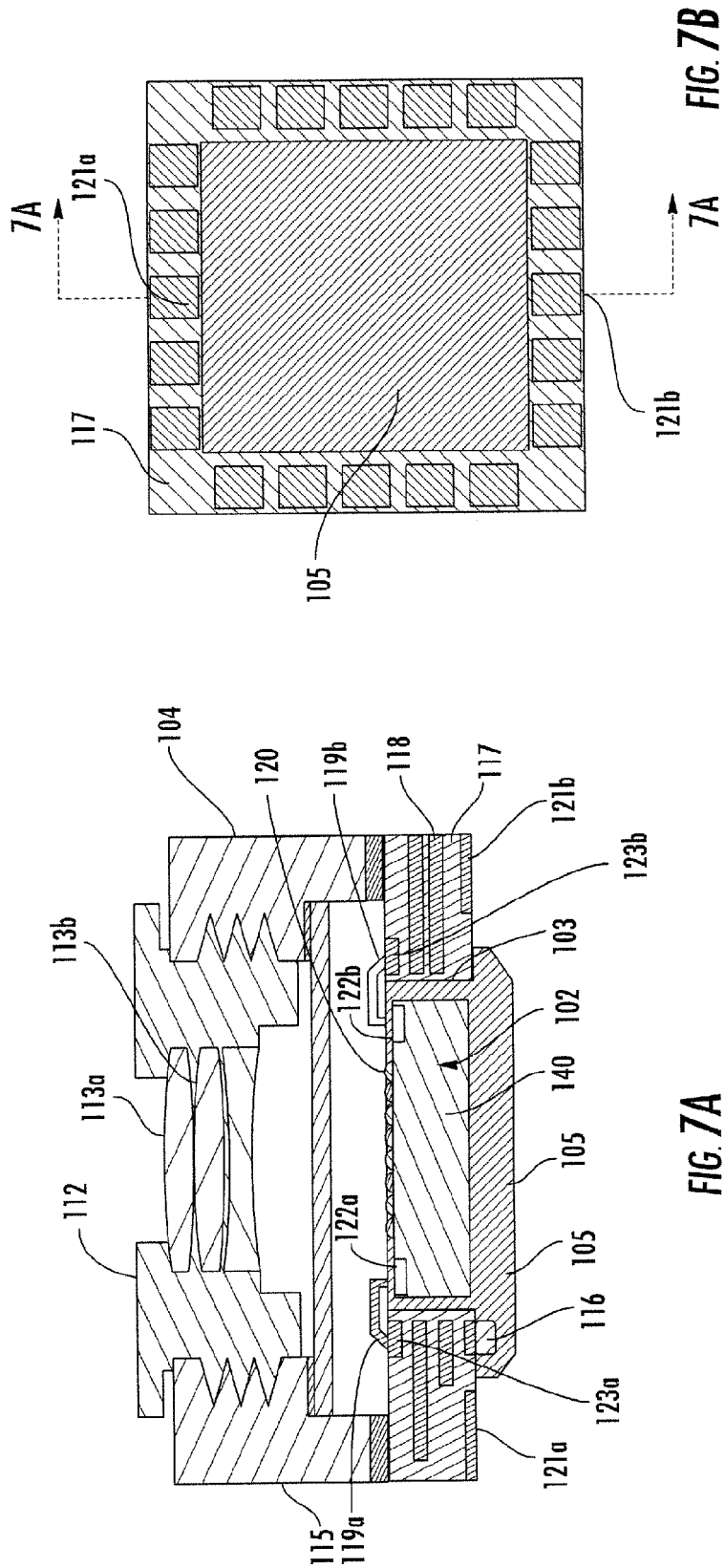

IMAGE SENSOR DEVICE WITH FLEXIBLE INTERCONNECT LAYER AND RELATED METHODS

RELATED APPLICATION

This application is based upon prior filed copending Chinese Application No. 201410537531.4 filed Oct. 11, 2014, the entire subject matter of which is incorporated herein by reference in its entirety.

FIELD OF THE DISCLOSURE

The present disclosure relates to the field of electronic devices, and, more particularly, to image sensors and related methods.

BACKGROUND

Typically, electronic devices include one or more camera modules for providing enhanced media functionality. For example, the typical electronic device may utilize the camera modules for photo capturing and video teleconferencing. In the typical electronic device with multiple camera modules, the primary camera module has a high pixel density and an adjustable focus lens system, while the secondary camera module is front-facing and has a lower pixel density. Also, the secondary camera module may have a fixed focus lens system.

For example, U.S. Patent Application No. 2009/0057544 to Brodie et al, assigned to the present application's assignee, discloses a camera module for a mobile device. The camera module comprises a lens, a housing carrying the lens, and a lens cap over the lens and housing. The camera module includes a barrel mechanism for adjusting the lens. During manufacture of an electronic device including one or more camera modules, there is a desire to manufacture the electronic device as quickly as possible, particularly in mass production runs.

The typical camera module is manufactured in a multi-step process. The first steps include semiconductor processing to provide the image sensor integrated circuit (IC). The next steps include some form of testing for the image sensor IC and packaging. The image sensor IC may be assembled into the camera module, along with a lens and movable barrel if needed. This assembly of the camera module may be performed manually or via machine. For example, in electronic devices that use surface mounted components, a pick-and-place (PNP) machine may assemble the components onto a printed circuit board (PCB). A drawback to such singular packaging is that it may be relatively inefficient and also may require that each device be tested individually, adding to the manufacturing time.

In some applications, it may helpful to manufacture the image sensor IC to include an infrared (IR) filter glass. In one approach, an IR filtering glass is attached over the image sensor IC. A potential drawback to this approach is that the overall thickness of the device may be increased, which may be undesirable for tight fitted mobile applications.

Referring to FIG. 1, an approach to an image sensor device 20 is shown. The image sensor device 20 illustratively includes an interconnect layer 21, an image sensor IC 22 on the interconnect layer, an adhesive layer 29 between the image sensor IC and the interconnect layer, and a plurality of bond wires 23a-23a coupling the image sensor IC to the interconnect layer. Also, the image sensor device 20 illustratively includes a lens module 27 over the interconnect layer 21, and an adhesive layer 72 coupling the lens module and the interconnect layer 21 together. The image sensor device 20 illustratively includes an adhesive layer 25 on the lens module 27, and an infrared (IR) filter 26 on the adhesive layer. The interconnect layer 21 illustratively includes a plurality of contacts 71a-71c.

SUMMARY

An image sensor device may include an interconnect layer having an opening extending therethrough, an image sensor IC within the opening and having an image sensing surface, and an IR filter aligned with the image sensing surface. The image sensor device may include an encapsulation material laterally surrounding the image sensor IC and filling the opening, and a flexible interconnect layer coupled to the interconnect layer opposite the image sensing surface.

In particular, the flexible interconnect layer may have an opening therein, and the encapsulation material may extend past the interconnect layer opposite the image sensing surface defining a flange portion or a peripheral portion. The opening of the flexible interconnect layer may be aligned with the flange portion.

The flexible interconnect layer may comprise a flexible substrate extending laterally outwardly from the interconnect layer, a plurality of electrically conductive traces on the flexible substrate, and a connector carried by the flexible substrate and coupled to the plurality of electrically conductive traces. The image sensor device may further comprise a lens assembly aligned with the IR filter.

Additionally, the image sensor device may further comprise an adhesive layer between the interconnect layer and the lens assembly. The image sensor IC may comprise a semiconductor substrate, and a plurality of electrically conductive bond pads adjacent the image sensing surface.

In some embodiments, the image sensor device may further comprise an electronic component in the encapsulation material and being coupled to the interconnect layer. The interconnect layer may comprise a plurality of electrically conductive traces therein, and a plurality of electrically conductive contacts coupled respectively to the plurality of electrically conductive traces. The image sensor device may further comprise a plurality of bond wires coupled between the plurality of electrically conductive contacts and the image sensor IC.

Another aspect is directed to a method of making an image sensor device. The method may comprise forming an interconnect layer to have an opening extending therethrough, and positioning an image sensor IC to be within the opening and have an image sensing surface. The method may include positioning an IR filter to be aligned with the image sensing surface, forming an encapsulation material to laterally surround the image sensor IC and fill the opening, and positioning a flexible interconnect layer to be coupled to the interconnect layer opposite the image sensing surface.

BRIEF DESCRIPTION OF THE DRAWINGS

FIGS. 3-6 are cross-section views of steps in the method for making the image sensor device of FIGS. 2A-2B.

FIGS. 7A and 7B are, respectively, cross-section (along line 7A) and bottom plan views of the image sensor device of FIGS. 2A-2B without the flexible interconnect layer.

DETAILED DESCRIPTION OF THE EMBODIMENTS

The present disclosure will now be described more fully hereinafter with reference to the accompanying drawings, in which embodiments of the disclosure are shown. These embodiments may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 1:
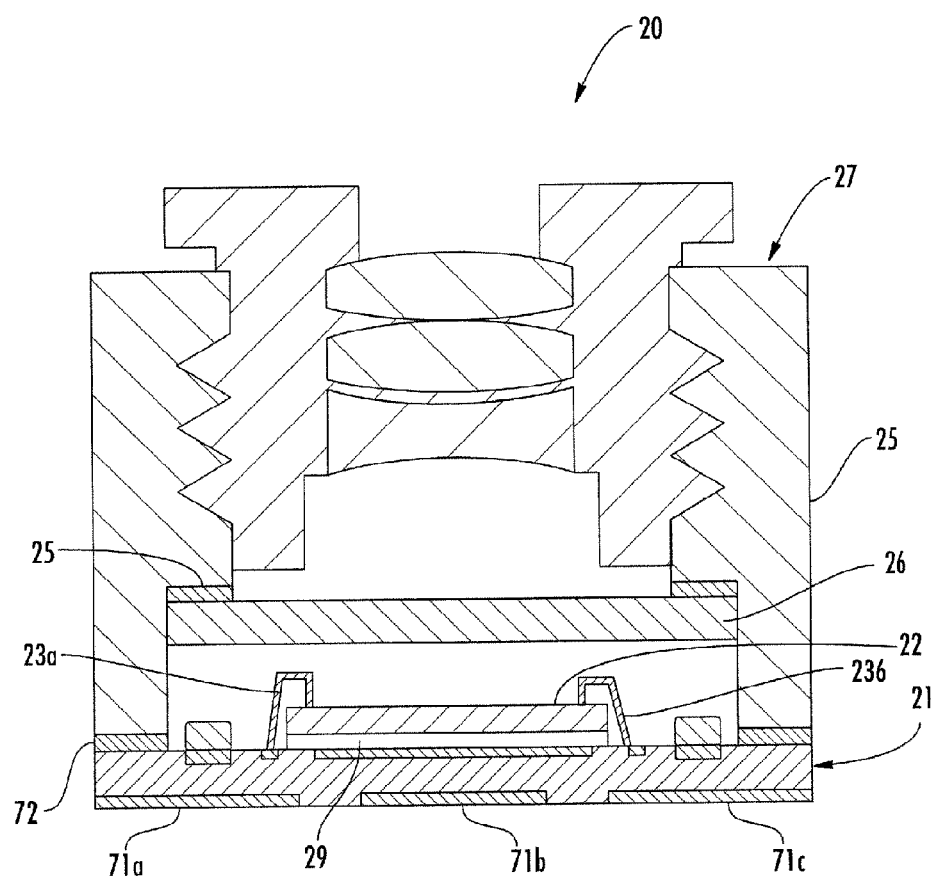
FIG. 1 is a cross-section view of an image sensor device, according to the prior art.
Figures 2A, 2B:
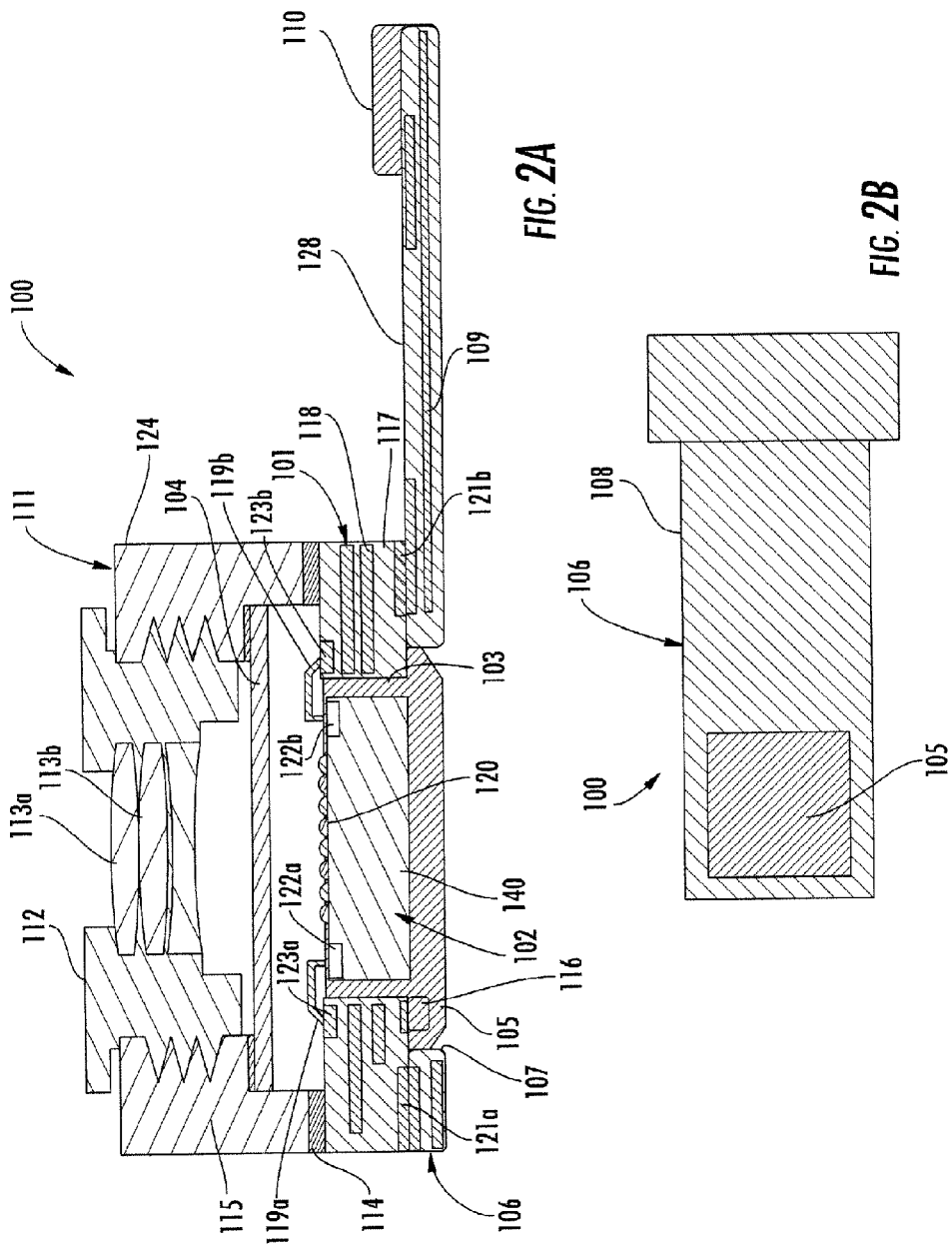
FIG. 2A is a cross-section view of an image sensor device, according to the present disclosure.
FIG. 2B is a bottom plan view of the image sensor device of FIG. 2A.

Referring initially to FIGS. 2A-2B, an image sensor device 100 according to the present disclosure is now described. The image sensor device 100 illustratively includes an interconnect layer 101 having an opening 103 (illustratively square/rectangle in shape) extending therethrough, an image sensor IC 102 within the opening and having an image sensing surface 120, and an IR filter 104 adjacent and aligned with the image sensing surface. The image sensor IC 102 illustratively includes a semiconductor substrate 140, and a plurality of electrically conductive bond pads 122a-122b adjacent the image sensing surface 120.

The image sensor device 100 illustratively includes an encapsulation material 105 laterally surrounding the image sensor IC 102 and filling the opening 103, and a flexible interconnect layer 106 aligned with and coupled to the interconnect layer opposite the image sensing surface 120. The flexible interconnect layer 106 illustratively includes an opening 107 (illustratively square/rectangle in shape) therein.

The encapsulation material 105 illustratively extends vertically past the interconnect layer 101 opposite the image sensing surface 120 defining a flange portion or a peripheral portion, and extending laterally on the interconnect layer to provide a mechanically secure coupling. As perhaps best seen in FIG. 2A, the flange portion is mushroom/rivet shaped. The opening 107 of the flexible interconnect layer 106 is aligned with the flange portion and abuts the flange portion of the encapsulation material 105.

The flexible interconnect layer 106 illustratively includes a flexible substrate 108 extending laterally outwardly from the interconnect layer 101, a plurality of electrically conductive traces 109 on the flexible substrate, and a connector 110 carried by the flexible substrate and coupled to the plurality of electrically conductive traces. The connector 110 would be coupled to external circuitry of an electronic device carrying the image sensor device 100.

The image sensor device 100 illustratively includes a lens assembly 111 adjacent the interconnect layer 101 and aligned with the IR filter 104. The lens assembly 111 illustratively includes a housing 124, a lens barrel 112 carried by the housing, and a plurality of lenses 113a-113b carried by the lens barrel. Additionally, the image sensor device 100 illustratively includes an adhesive layer 114 between the interconnect layer 101 and the lens assembly 111, and another adhesive layer 115 between the lens assembly and the IR filter 104.

In the illustrated embodiment, the image sensor device 100 illustratively includes an electronic component 116 (e.g. a capacitor, a resistor, a processor) in the encapsulation material 105 and being coupled to the interconnect layer 101. In other embodiments, the electronic component 116 may be surface mounted on the flexible interconnect layer 106.

The interconnect layer 101 illustratively includes a substrate 117, a plurality of electrically conductive traces 118 carried by the substrate, a plurality of first electrically conductive contacts 123a-123b coupled respectively to the plurality of electrically conductive traces on an upper surface of the substrate, and a plurality of second electrically conductive contacts 121a-121b coupled respectively to the plurality of electrically conductive traces on a lower surface of the substrate. As perhaps best seen in FIG. 7B, the plurality of second electrically conductive contacts 121a-121b is arranged in a square shaped pad, and the flange portion extends over the interconnect layer 101 on all four sides of the opening 103.

The image sensor device 100 illustratively includes a plurality of bond wires 119a-119b coupled between the plurality of first electrically conductive contacts 123a-123b and the plurality of electrically conductive bond pads 122a-122b of the image sensor IC 102. The plurality of second electrically conductive contacts 121a-121b is coupled to the plurality of electrically conductive traces 109 on the flexible substrate 108.

As will be appreciated, any of the above noted electrically conductive components may comprise at least one of copper, aluminum, gold, tin, and silver. This list is merely exemplary and many other electrically conductive materials can be used. Moreover, the substrates 117, 108 may comprise a dielectric material.

Advantageously, the image sensor device 100 provides a low profile device, which is desirable for mobile device applications. Moreover, this low profile is achieved without using through silicon via technology, which can be costly. This image sensor device 100 provides a reduced distance between the image sensor IC 102 and the lens 113a-113b. Also, using the flange portion of the encapsulation material 105, the attachment of the flexible interconnect layer 106 does not add to the overall height of the image sensor device 100.

Another aspect is directed to a method of making an image sensor device 100. The method may comprise forming an interconnect layer 101 to have an opening 103 extending therethrough, and positioning an image sensor IC 102 to be within the opening and have an image sensing surface 120. The method may include positioning an IR filter 104 to be adjacent and aligned with the image sensing surface 120, forming an encapsulation material 105 to laterally surround the image sensor IC 102 and fill the opening 103, and positioning a flexible interconnect layer 106 to be aligned with the interconnect layer 101 opposite the image sensing surface.

Referring now additionally to FIGS. 3-7B, an exemplary embodiment of a method for making the image sensor device 100 is now described. In FIG. 3, the base is formed from a carrier layer 130, and an adhesive layer 131 thereon. The substrate portions are attached to the carrier layer 130 to define the interconnect layer 101 for first and second image sensor devices 100a, 100b. It will be appreciated that the illustrated example produces two image sensor devices 100a, 100b for illustrative purposes only, and that the disclosed method can manufacture more devices simultaneously.

In FIG. 4, the encapsulation material 150a, 105b is formed during a molding process. In FIG. 5, the carrier layer 130 is released and the substrate portions are flipped, and the plurality of bond wires 119aa-119bb are formed for coupling between the plurality of electrically conductive contacts 123aa-123bb and the plurality of electrically conductive bond pads 122aa-122bb of the image sensor ICs 102a, 102b In FIG. 6, the lens assemblies 111a, 111b are attached to the substrate portions. In FIGS. 7A-7B, the image sensor devices 100a, 100b are singulated via a saw blade, for example. Lastly, the flexible interconnect layer 106 is coupled to the image sensor devices 100*a*, 100*b*.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An image sensor device comprising:
    an interconnect layer comprising a dielectric layer, and at least one electrical conductor carried internally in said dielectric layer;
    said interconnect layer having an opening extending therethrough;
    an image sensor integrated circuit (IC) within the opening and having an image sensing surface;
    an infrared (IR) filter aligned with the image sensing surface;
    an encapsulation material laterally surrounding said image sensor IC and filling the opening; and
    a flexible interconnect layer coupled to said interconnect layer opposite the image sensing surface.

2. The image sensor device of claim 1 wherein said flexible interconnect layer has an opening therein; wherein said encapsulation material extends past said interconnect layer opposite the image sensing surface defining a peripheral portion; and wherein the opening of said flexible interconnect layer is aligned with the peripheral portion.

3. The image sensor device of claim 1 wherein said flexible interconnect layer comprises a flexible substrate extending laterally outwardly from said interconnect layer, a plurality of electrically conductive traces on said flexible substrate, and a connector carried by said flexible substrate and coupled to said plurality of electrically conductive traces.

4. The image sensor device of claim 1 further comprising a lens assembly aligned with said IR filter.

5. The image sensor device of claim 4 further comprising an adhesive layer between said interconnect layer and said lens assembly.

6. The image sensor device of claim 1 wherein said image sensor IC comprises a semiconductor substrate, and a plurality of electrically conductive bond pads adjacent the image sensing surface.

7. The image sensor device of claim 1 further comprising an electronic component in said encapsulation material and being coupled to said interconnect layer.

8. The image sensor device of claim 1 wherein said at least one electrical conductor comprises a plurality thereof; and wherein said interconnect layer comprises a plurality of electrically conductive contacts coupled respectively to said plurality of electrical conductors.

9. The image sensor device of claim 8 further comprising a plurality of bond wires coupled between said plurality of electrically conductive contacts and said image sensor IC.

10. An image sensor device comprising:
    an interconnect layer having an opening extending therethrough;
    an image sensor integrated circuit (IC) within the opening and having an image sensing surface;
    an infrared (IR) filter aligned with the image sensing surface;
    a lens assembly aligned with said IR filter;
    an encapsulation material laterally surrounding said image sensor IC and filling the opening, said encapsulation material extending past said interconnect layer opposite the image sensing surface defining a peripheral portion; and
    a flexible interconnect layer coupled to said interconnect layer opposite the image sensing surface, said flexible interconnect layer having an opening therein aligned with the peripheral portion.

11. The image sensor device of claim 10 wherein said flexible interconnect layer comprises a flexible substrate extending laterally outwardly from said interconnect layer, a plurality of electrically conductive traces on said flexible substrate, and a connector carried by said flexible substrate and coupled to said plurality of electrically conductive traces.

12. The image sensor device of claim 10 further comprising an adhesive layer between said interconnect layer and said lens assembly.

13. The image sensor device of claim 10 wherein said image sensor IC comprises a semiconductor substrate, and a plurality of electrically conductive bond pads adjacent the image sensing surface.

14. The image sensor device of claim 10 further comprising an electronic component in said encapsulation material and being coupled to said interconnect layer.

15. The image sensor device of claim 10 wherein said interconnect layer comprises a plurality of electrically conductive traces therein, and a plurality of electrically conductive contacts coupled respectively to said plurality of electrically conductive traces.

16. A method of making an image sensor device comprising:
    forming an interconnect layer comprising a dielectric layer, and at least one electrical conductor carried internally in the dielectric layer, the interconnect layer to have an opening extending therethrough;
    positioning an image sensor integrated circuit (IC) to be within the opening and have an image sensing surface;
    positioning an infrared (IR) filter to be aligned with the image sensing surface;
    forming an encapsulation material to laterally surround the image sensor IC and fill the opening; and
    positioning a flexible interconnect layer to be coupled to the interconnect layer opposite the image sensing surface.

17. The method of claim 16 wherein the flexible interconnect layer has an opening therein;
    wherein the encapsulation material extends past the interconnect layer opposite the image sensing surface defining a peripheral portion; and wherein the opening of the flexible interconnect layer is aligned with the peripheral portion.

18. The method of claim 16 wherein the flexible interconnect layer comprises a flexible substrate extending laterally outwardly from the interconnect layer, a plurality of electrically conductive traces on the flexible substrate, and a connector carried by the flexible substrate and coupled to the plurality of electrically conductive traces.

19. The method of claim 16 further comprising positioning a lens assembly aligned with the IR filter.

20. The method of claim 19 further comprising forming an adhesive layer to be between the interconnect layer and the lens assembly.

21. The method of claim 16 wherein the image sensor IC comprises a semiconductor substrate, and a plurality of electrically conductive bond pads adjacent the image sensing surface.

22. The method of claim 16 further comprising positioning an electronic component to be in the encapsulation material and be coupled to the interconnect layer.

23. The method of claim 16 wherein the at least one electrical conductor comprises a plurality thereof; and wherein the interconnect layer comprises a plurality of electrically conductive contacts to be coupled respectively to the plurality of electrical conductors.

24. The method of claim 23 further comprising forming a plurality of bond wires to be coupled between the plurality of electrically conductive contacts and the image sensor IC.

\* \* \* \* \*